(12) United States Patent
Lee

(10) Patent No.: US 9,735,389 B2
(45) Date of Patent: Aug. 15, 2017

(54) ORGANIC LIGHT-EMITTING DISPLAY DEVICE AND METHOD OF MANUFACTURING THE SAME

(71) Applicant: SAMSUNG DISPLAY CO., LTD., Yongin, Gyeonggi-Do (KR)

(72) Inventor: Hyunshik Lee, Incheon (KR)

(73) Assignee: Samsung Display Co., Ltd., Yongin-Si, Gyeonggi-do (KR)

( * ) Notice: Subject to any disclaimer, the term of this patent is extended or adjusted under 35 U.S.C. 154(b) by 67 days.

(21) Appl. No.: 14/864,383

(22) Filed: Sep. 24, 2015

(65) Prior Publication Data

US 2016/0172425 A1    Jun. 16, 2016

(30) Foreign Application Priority Data

Dec. 12, 2014 (KR) ........................ 10-2014-0179601

(51) Int. Cl.
*H01L 51/52* (2006.01)
*H01L 27/32* (2006.01)

(52) U.S. Cl.
CPC ...... *H01L 51/5243* (2013.01); *H01L 51/5228* (2013.01); *H01L 27/3244* (2013.01); *H01L 51/524* (2013.01); *H01L 51/525* (2013.01); *H01L 51/5253* (2013.01); *H01L 2227/323* (2013.01)

(58) Field of Classification Search
None
See application file for complete search history.

(56) References Cited

U.S. PATENT DOCUMENTS

| | | | |
|---|---|---|---|
| 4,894,127 A | 1/1990 | Wong et al. | |
| 6,798,132 B2 * | 9/2004 | Satake | H01L 27/322 257/347 |
| 6,879,099 B2 * | 4/2005 | Kihara | H01L 51/5088 313/504 |
| 7,486,368 B2 * | 2/2009 | Sakakura | H01L 51/5237 349/153 |
| 7,633,223 B2 * | 12/2009 | Yamazaki | H01L 27/3246 313/503 |
| 7,753,751 B2 * | 7/2010 | Yamazaki | H01L 27/3246 313/506 |
| 7,764,012 B2 * | 7/2010 | Yamazaki | H01L 27/3276 313/498 |

(Continued)

FOREIGN PATENT DOCUMENTS

| | | |
|---|---|---|
| JP | 2012-182129 A | 9/2012 |
| KR | 10-2009-0094692 A | 9/2009 |
| KR | 10-2011-0090391 A | 8/2011 |

*Primary Examiner* — Lex Malsawma
(74) *Attorney, Agent, or Firm* — Lee & Morse, P.C.

(57) ABSTRACT

An organic light-emitting display device includes a first substrate including a first base layer, an element layer disposed on the first base layer and including a plurality of emission patterns, and a protection layer that is non-conductive, the protection layer covering the element layer, and a second substrate disposed on the first substrate, and the second substrate including a plurality of nanorods extending toward the first substrate, at least a portion of the nanorods penetrating the protection layer, the second substrate being electrically connected to the element layer through the nanorods penetrating the protection layer.

13 Claims, 15 Drawing Sheets

(56) References Cited

U.S. PATENT DOCUMENTS

| | | | |
|---|---|---|---|
| 7,960,733 B2* | 6/2011 | Yamazaki | G02F 1/136227 257/59 |
| 8,040,059 B2* | 10/2011 | Imai | H01L 27/3258 313/506 |
| 8,179,040 B2* | 5/2012 | Tsuchiya | H01L 51/5253 313/504 |
| 8,679,630 B2 | 3/2014 | Maschmann et al. | |
| 2002/0024096 A1* | 2/2002 | Yamazaki | H01L 27/32 257/359 |
| 2002/0180371 A1* | 12/2002 | Yamazaki | H01L 27/3246 315/169.3 |
| 2004/0137142 A1* | 7/2004 | Nishikawa | H01L 27/3276 427/66 |
| 2005/0189878 A1* | 9/2005 | Shitagami | H01L 51/525 313/512 |
| 2005/0247938 A1* | 11/2005 | Okamoto | H01L 27/12 257/59 |
| 2006/0055313 A1* | 3/2006 | Bae | H01L 27/3246 313/500 |
| 2007/0096616 A1* | 5/2007 | Han | H01L 21/76852 313/309 |
| 2010/0307592 A1 | 12/2010 | Chang et al. | |

\* cited by examiner

ORGANIC LIGHT-EMITTING DISPLAY DEVICE AND METHOD OF MANUFACTURING THE SAME

CROSS-REFERENCE TO RELATED APPLICATION

Korean Patent Application No. 10-2014-0179601, filed on Dec. 12, 2014, in the Korean Intellectual Property Office, and entitled: "Organic Light-Emitting Display Device and Method Of Manufacturing The Same," is incorporated by herein by reference.

BACKGROUND

1. Field

Embodiments relate to a display device and a method of manufacturing the same.

2. Description of the Related Art

An organic light-emitting display device is a display device that has a light-emitting layer formed of an organic material between an anode and a cathode. Since among such display devices, the organic light-emitting display device has a wide viewing angle and a rapid response speed, the organic light-emitting display device has been in the spotlight as the next generation display device.

SUMMARY

Embodiments are directed to an organic light-emitting display device, including a first substrate including a first base layer, an element layer disposed on the first base layer and including a plurality of emission patterns, and a protection layer that is non-conductive, the protection layer covering the element layer, and a second substrate disposed on the first substrate, and the second substrate including a plurality of nanorods extending toward the first substrate, at least a portion of the nanorods penetrating the protection layer, the second substrate being electrically connected to the element layer through the nanorods penetrating the protection layer.

Each of the nanorods may have a diameter ranging from about 10 nm to about 120 nm.

The first substrate may be partitioned into a plurality of emission regions overlapping the emission patterns respectively, and a non-emission region adjacent to the emission regions, and the nanorods penetrating the protection layer may be connected to the element layer at the non-emission region.

The element layer may include a first electrode layer to receive a first power voltage, a pixel definition layer overlapping the non-emission region, and exposing portions of the first electrode layer, the portions overlapping the emission regions, an organic layer disposed on the first electrode layer, and including the emission patterns, and a second electrode layer disposed between the organic layer and the protection layer, and to receive a second power voltage different from the first power voltage. The nanorods penetrating the protection layer may be directly connected to the second electrode layer.

The second electrode layer may include a first portion overlapping the emission regions, and a second portion overlapping the non-emission region, and the nanorods penetrating the protection layer may contact the second portion, and may be spaced apart from the first portion.

The second substrate may further include a second base layer including a first surface facing the first substrate, and a second surface opposed to the first surface, and a conductive layer disposed on the first surface to be connected to the nanorods, and overlapping the emission regions and the non-emission region, the conductive layer to receive the second power voltage through the nanorods penetrating the protection layer.

The nanorods may include a transparent conductive oxide.

The conductive layer may be formed of the same material as the nanorods.

The second base layer may be a glass substrate.

The second substrate may further include a touch electrode layer that is disposed on the second surface to sense a touch event that occurs on the second surface.

The organic light-emitting display device may further include a sealing member disposed between the first substrate and the second substrate to seal and couple the first substrate and the second substrate, the first substrate being partitioned into a pixel region including the emission regions, and a peripheral region surrounding the pixel region, the sealing member being disposed at the peripheral region, and a filler interposed between the first substrate and the second substrate that are sealed by the sealing member.

The sealing member may include an inorganic material.

The organic light-emitting display device may further include a power line to apply the second power voltage to the second electrode layer, the power line being disposed between the sealing member and the pixel region in a plan view.

Embodiments are also directed to a method of manufacturing an organic light-emitting display device, the method including forming a first substrate on which a plurality of organic light-emitting diodes are disposed, forming a second substrate having a plurality of nanorods disposed at one side thereof, and coupling the first substrate and the second substrate so as to be electrically connected to each other through the plurality of nanorods.

The forming of the second substrate may include providing a base substrate including a first surface that faces the one side, and a second surface that is opposed to the first surface, forming a first layer including a conductive material on the first surface, forming a second layer including a conductive material on the first layer, anodizing the second layer to form a plurality of nanostructures, patterning at least a portion of the first layer to form the nanorods, and removing the nanostructures.

The first layer may be patterned using the nanostructures as a mask.

The forming of the first substrate may include forming the organic light-emitting diodes on the base substrate partitioned into a plurality of emission regions and a non-emission region adjacent to the emission regions such that the organic light-emitting diodes are respectively disposed on the emission regions, and forming a protection layer covering the organic light-emitting diodes on the organic light-emitting diodes. The protection layer may be non-conductive, and the plurality of nanorods may penetrate the protection layer to be connected to the organic light-emitting diodes.

Each of the organic light-emitting diodes may includes a first electrode disposed on the base substrate, a light-emitting layer disposed on the first electrode and generating light, and a second electrode disposed on the light-emitting layer, and overlapping the emission regions and the non-emission region, and the nanorods may penetrate the protection layer to be connected to the second electrode layer.

The nanorods may be connected to the second electrode at the non-emission region.

BRIEF DESCRIPTION OF THE DRAWINGS

Features will become apparent to those of skill in the art by describing in detail exemplary embodiments with reference to the attached drawings in which.

DETAILED DESCRIPTION

Figure 1A:
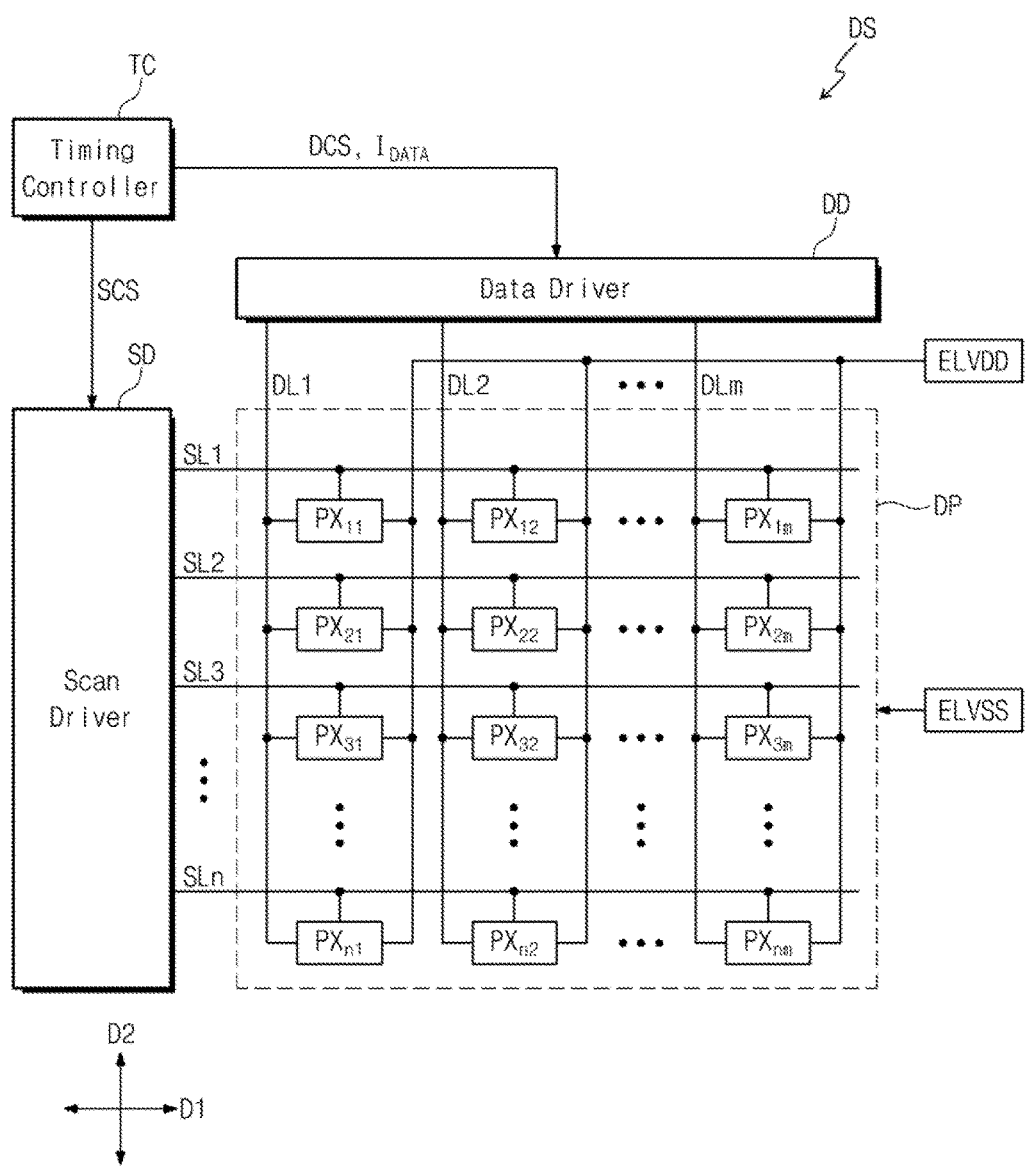
FIG. 1A illustrates a block diagram showing an organic light-emitting display device according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

It will also be understood that when a layer is referred to as being formed or disposed "over" or "on" another layer or substrate, it can be formed or disposed directly on the other layer or substrate or other layers may be present therebetween. Also, one surface of any layer is evenly shown in the drawings, but is unnecessary only limited to the flat surface, and in a stacking process, a step may be generated on a surface of an upper layer by a surface shape of a lower layer. Also, the term "line" means a signal wiring formed of a conductive material.

FIG. 1A illustrates a block diagram showing an organic light-emitting display device according to an example embodiment. FIG. 2 illustrates an equivalent circuit diagram of a pixel illustrated in FIG. 1.

Hereinafter, referring to FIGS. 1 to 2, an organic light-emitting display device according to an example embodiment will be described.

An organic light-emitting display device includes a timing controller TC, a gate driver GD, a data driver DD, and an organic light-emitting display panel DP (hereinafter, referred to as "display panel").

The timing controller TC receives input image signals, and outputs image data IDATA converted so as to correspond to a driving mode of the display panel DP, and various control signals SCS and DCS.

The gate driver GD receives the gate driving control signal SCS from the timing controller TC. The gate driver GD, which receives the gate driving control signal SCS, generates a plurality of gate signals. The plurality of gate signals are sequentially supplied to the display panel DP.

The data driver DD receives the data driving control signal DCS and the converted image data IDATA from the timing controller TC. The data driver DD generates a plurality of data signals on the basis of the data driving control signal DCS and the converted image data IDATA. The plurality of data signals are supplied to the display panel DP.

The display panel DP receives an electric signal from an outside to display an image. The display panel DP includes a plurality of scan lines SL1 to SLn, a plurality of data lines DL1 to DLm, and a plurality of pixels PX11 to PXnm.

The scan lines SL1 to SLn extend in a first direction D1, and are arranged in a second direction D2 intersecting with the first direction D1. The scan lines SL1 to SLn are sequentially supplied with gate signals from the gate driver GD.

The data lines DL1 to DLm intersect with the scan lines SL1 to SLn so as to be insulated therefrom. The data lines DL1 to DLm extend in the second direction D2, and are arranged in the first direction D1. The data lines DL1 to DLm receive data signals from the data driver DD.

The display panel DP is supplied with first power voltage ELVDD and second power voltage ELVSS from the outside. Each of the pixels PX11 to PXnm responds to a corresponding gate signal to be turned on. Each of the pixels PX11 to PXnm receives the first power voltage ELVDD and the second power voltage ELVSS, and responds to a corresponding data signal to generate light. The first power voltage ELVDD is higher than the second power voltage ELVSS.

The pixels PX11 to PXnm may be arranged in a matrix configuration. Each of the pixels PX11 to PXnm is connected to a corresponding scan line of the scan lines SL1 to SLn, and is connected to a corresponding data line of the data lines DL1 to DLm.

Each of the pixels PX11 to PXnm receives a gate signal from the corresponding scan line, and receives a data signal from the corresponding data line. Each of the pixels PX11 to PXnm responds to the corresponding gate signal to be turned on. Each of the pixels PX11 to PXnm generates light corresponding to a corresponding data signal to display an image.

Each of pixels PX11 to PXnm includes at least one transistor, at least one capacitor, and an organic light-emitting diode. FIG. 2 exemplarily illustrates an equivalent circuit of a pixel PXij that is connected to an i-th scan line Gi of the plurality of scan lines SL1 to SLn, and a j-th data line Dj of the plurality of data lines DL1 to DLm.

The pixel PXij includes a first thin film transistor TFT1, a second thin film transistor TFT2, a capacitor Cap, and an organic light-emitting diode OLEDij. The first thin film transistor TFT1 includes a control electrode connected to the i-th scan line Si, an input electrode connected to the j-th data line Dj, and an output electrode. The first thin film transistor TFT1 responds to a scan signal applied to the i-th scan line Si to output a data signal applied to the j-th data line Dj.

The capacitor Cap includes a first capacitor electrode connected to the first thin film transistor TFT1, and a second capacitor electrode receiving the first power voltage ELVDD. The capacitor Cap charges electric charges corresponding to a difference between a voltage corresponding to the data signal received from the first thin film transistor TFT1 and the first power voltage ELVDD.

The second thin film transistor TFT2 includes a control electrode connected to the output electrode of the first thin film transistor TFT1 and the first capacitor electrode of the capacitor Cap, an input electrode receiving the first power voltage ELVDD, and an output electrode. The output electrode of the second thin film transistor TFT2 is connected to the organic light-emitting diode OLEDij.

The second thin film transistor TFT2 responds to the electric charge stored in the capacitor Cap to control a driving current flowing through the organic light-emitting diode OLEDij. A turn-on time of the second thin film transistor TFT2 is determined according to the electric charge stored in the capacitor Cap. Substantially, the output electrode of the second thin film transistor TFT2 supplies a voltage lower than the first power voltage ELVDD to the organic light-emitting diode OLEDij.

The organic light-emitting diode OLEDij includes a first electrode connected to the second thin film transistor TFT2, and a second electrode receiving the second power voltage ELVSS. The organic light-emitting diode OLEDij may include an emission pattern disposed between the first electrode and the second electrode.

The organic light-emitting diode OLEDij emits light during a turn-on period of the second tin film transistor TFT2. A color of light generated in the organic light-emitting device OLEDij is determined by a material forming the emission pattern. For example, the color of the light generated in the organic light-emitting diode OLEDij may be any one of red, green, blue, and white.

Figure 2A:
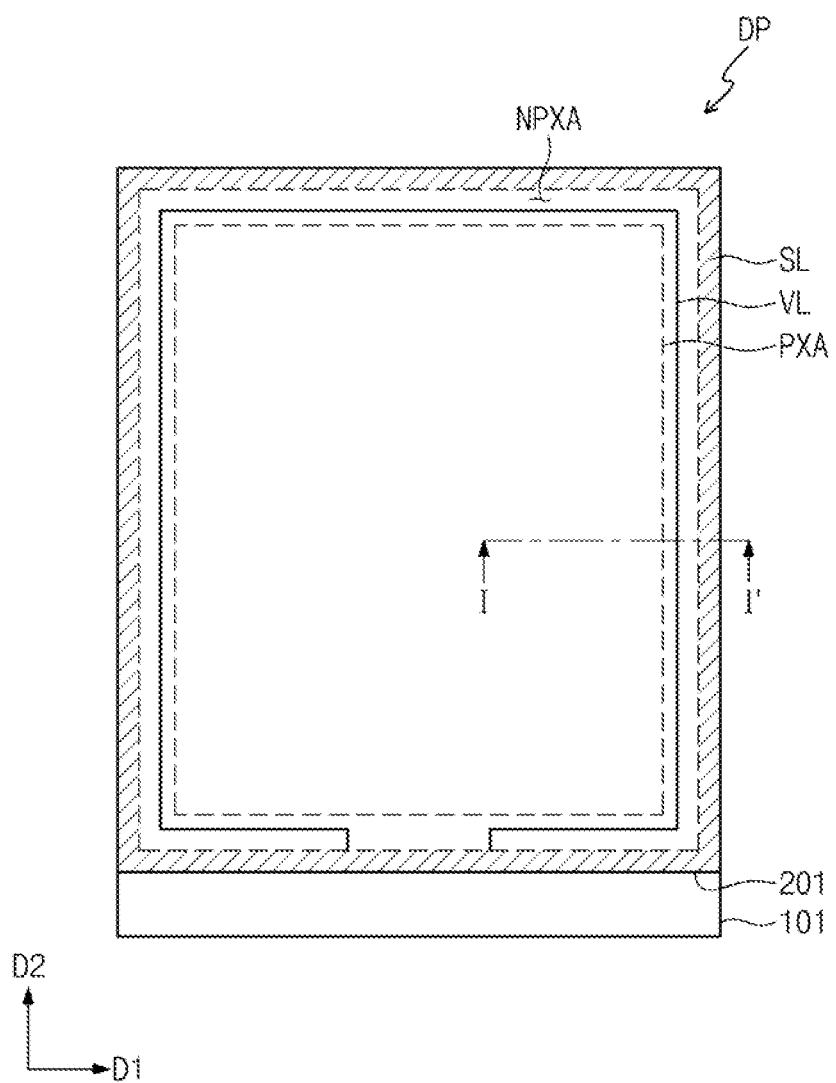
FIG. 2A illustrates a plan view illustrating a display device according to an example embodiment.
Figure 2B:
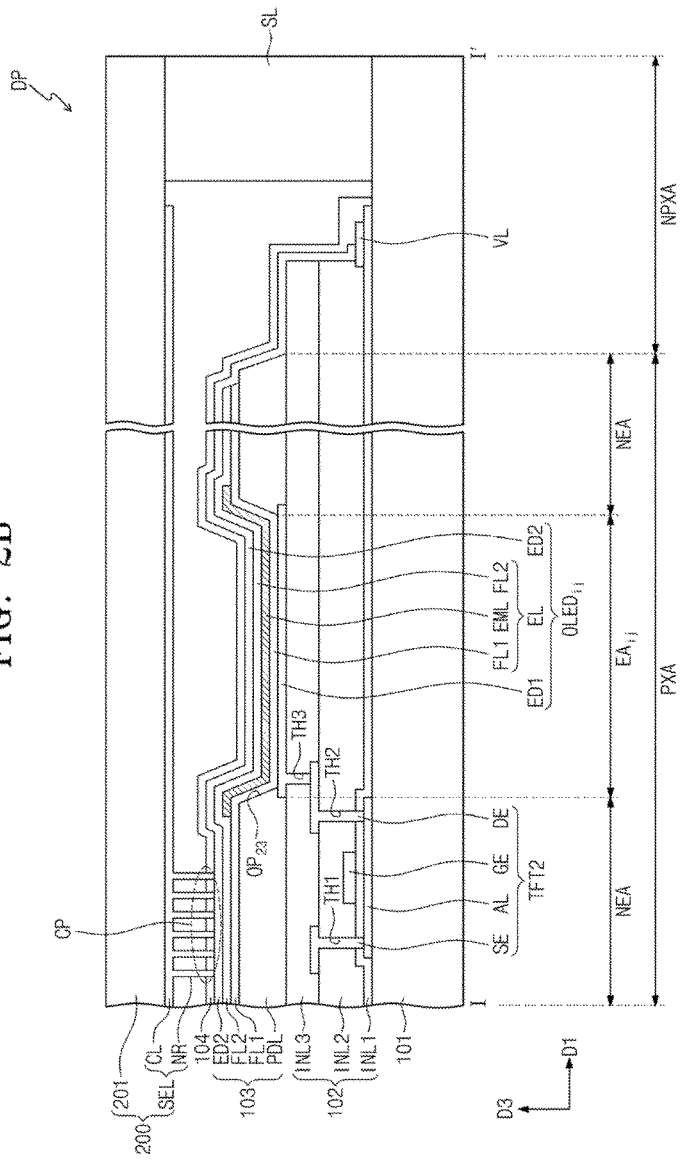
FIG. 2B illustrates a cross-sectional view taken along line I-I' of FIG. 2A.

FIG. 2A illustrates a plan view illustrating a display panel according to an example embodiment. FIG. 2B is a cross-sectional view taken along line I-I' of FIG. 2A.

Referring to FIGS. 2A and 2B, a display device according to an example embodiment will be briefly described. The same elements as those illustrated in FIGS. 1A to 1B will be represented by the same reference numerals, and a description thereof will be omitted.

A display panel DP includes a first substrate 100, a second substrate 200, and a sealing member SL disposed between the first substrate 100 and the second substrate 200.

The first substrate 100 includes pixels PX11 to PXnm (see FIG. 1), and generates an image. The first substrate 100 may be partitioned into a pixel region PXA and a peripheral region NPXA on a plane defined by a first direction D1 and a second direction D2.

The pixel region PXA is a region on which pixels are disposed. The pixel region PXA is disposed on a central portion of the first substrate 100. The first substrate 100 is electrically connected to the second substrate 200 through the pixel region PXA.

The second substrate 200 is disposed on the first substrate 100.

The second substrate 200 may have an area equal to or smaller than that of the first substrate 100 in a plan view.

A portion of the first substrate 100 may be exposed from the second substrate 200.

At least one pad may be disposed on a portion of the first substrate 100 exposed from the second substrate 200. The at least one pad may be pads that are connected to at least one selected from the scan lines SL1 to SLn, the data lines DL1 to DLm, and a power line VL.

A sealing member SL is disposed on the peripheral region NPXA. The sealing member SL may be disposed along an edge of the second substrate 200. The sealing member SL couples the first substrate 100 and the second substrate 200.

The display panel DP may further include a power line VL. The power line VL is disposed on the first substrate 100 to supply second power voltage ELVSS (see FIG. 1B) to each of the pixels PX11 to PXnm.

The power line VL may be disposed between the pixel region PXA and the sealing member SL on a plane. One end of the power line VL may be connected to an outside power source (not shown). The power line VL receives the second power voltage ELVSS from the outer power source to supply the second power voltage ELVSS to the pixels PX11 to PXnm.

In the present example embodiment, the power line VL is disposed so as to surround the pixel region PXA. In other embodiments, the power line VL may be disposed in various shapes.

The pixel region PXA includes a plurality of emission regions and a non-emission region NEA. Organic light-emitting diodes are disposed on the emission regions, respectively.

Figure 1B:
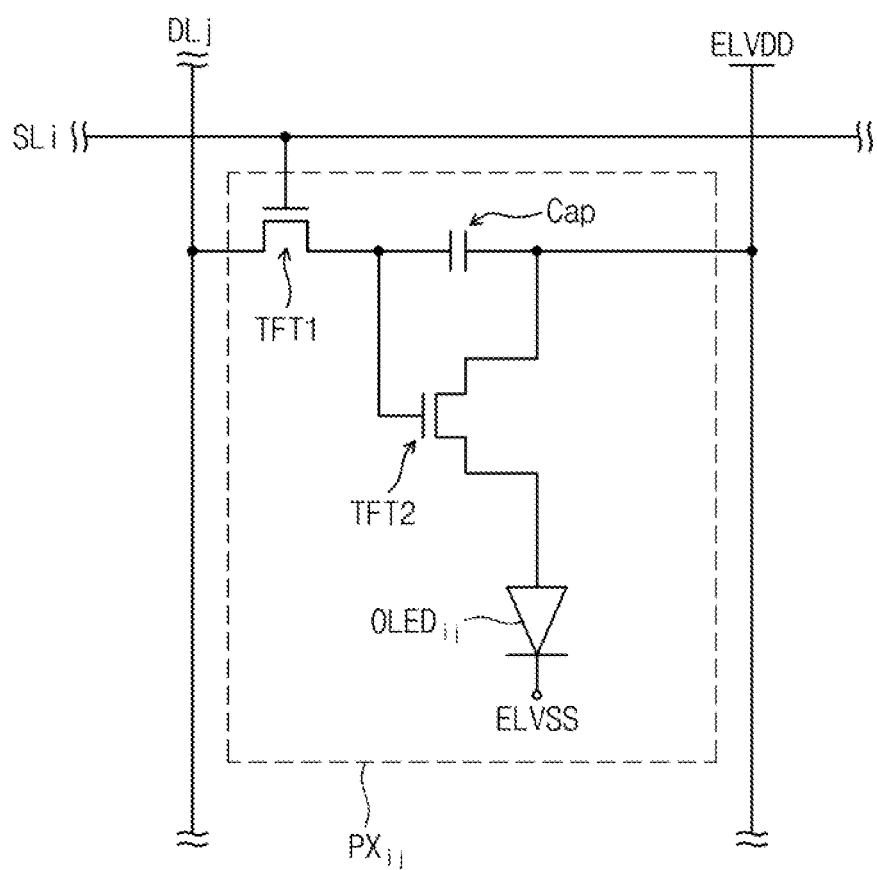
FIG. 1B illustrates an equivalent circuit diagram of one pixel shown in FIG. 1.

The non-emission region NEA is adjacent to the emission regions. FIG. 2B exemplarily illustrates an emission region EAij on which the organic light-emitting diode OLEDij illustrated in FIG. 1B is disposed. An upper surface of the non-emission region NEA relatively protrudes compared to an upper surface of the emission region EAij in a cross-section defined in a third direction.

The first substrate 100 includes a first base layer 101, a circuit layer 102, an element layer 103, and a protection layer 104. The first base layer 101 may have a square shape on a plane. In other embodiments, the first base layer 101 may have various shapes.

The first base layer 101 may be an insulation substrate. For example, the first base layer 101 may be a glass substrate or a plastic substrate.

Figure 3A:
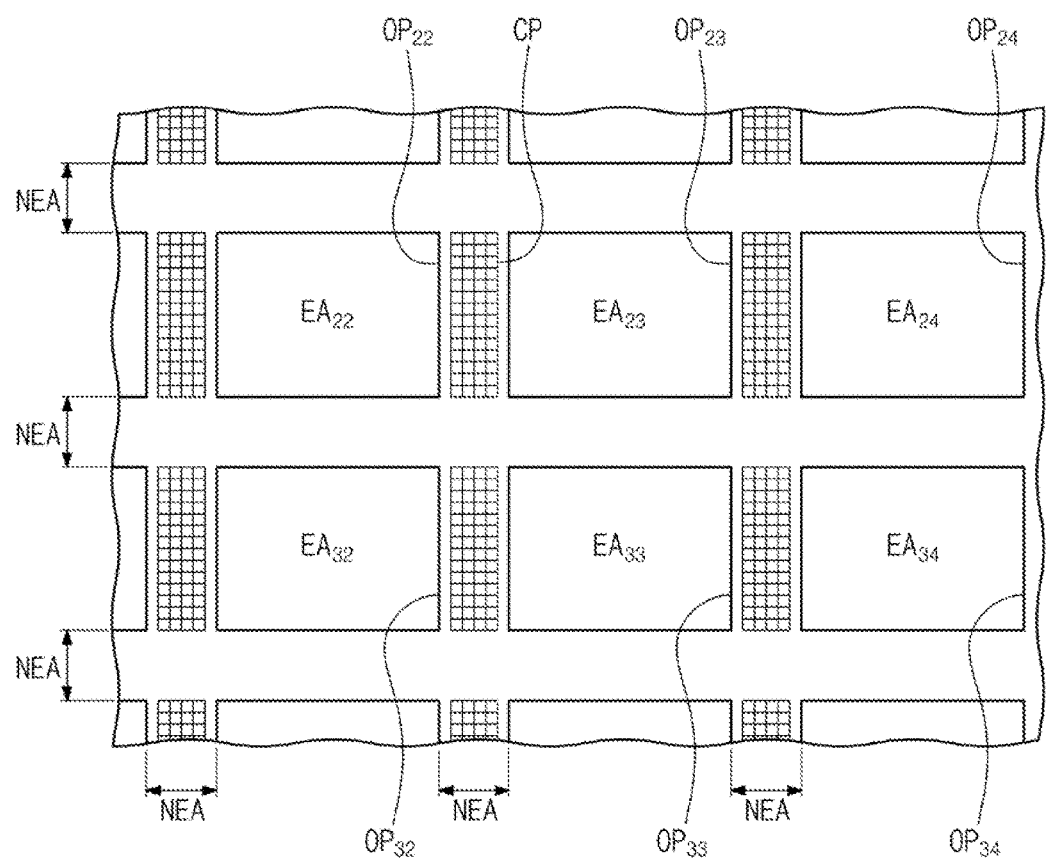
FIG. 3A illustrates a schematic plan view illustrating a portion of a display device.
Figure 3B:
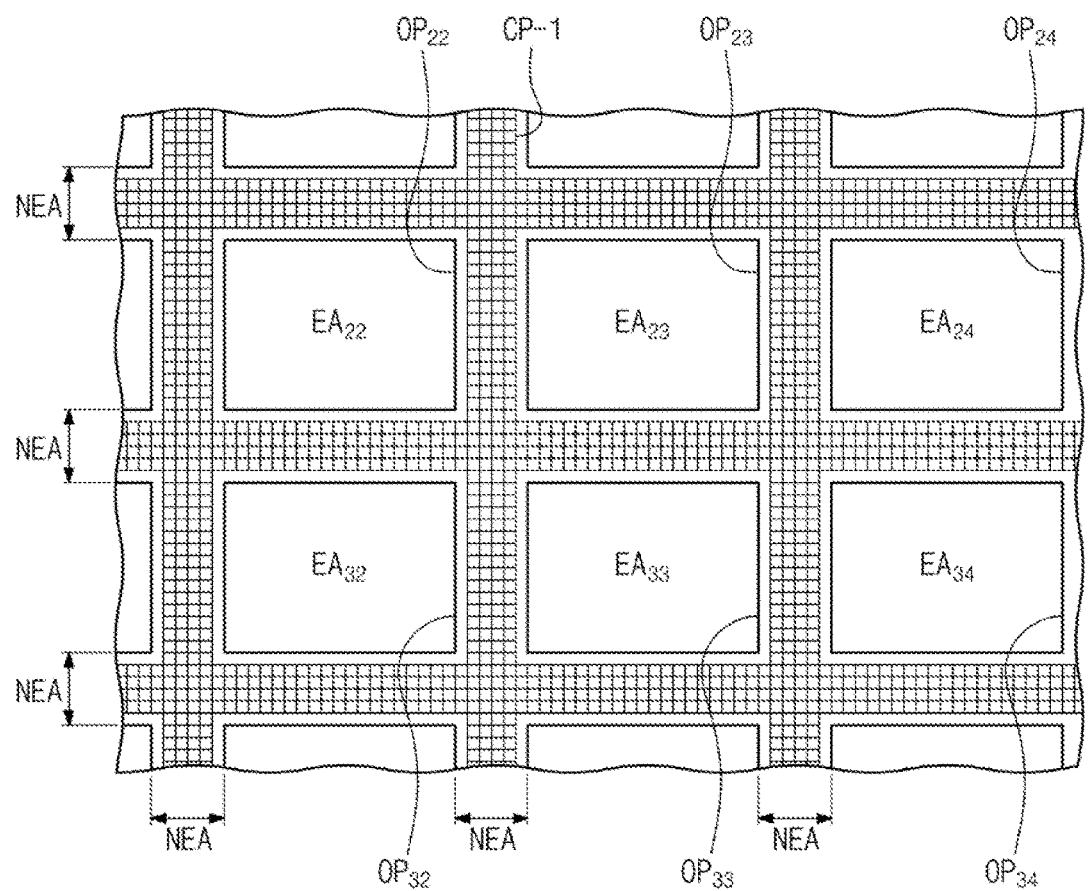
FIG. 3B illustrates a schematic plan view illustrating a portion of a display device.

The circuit layer 102 is disposed on the first base layer 101. The circuit layer 102 may include a first thin film transistor TFT1, a capacitor Cap, a second thin film transistor TFT2, and a plurality of insulation films. FIG. 3B exemplarily illustrates a region on which the second thin film transistor TFT2 is disposed.

The second thin film transistor TFT2 includes a semiconductor layer AL, a control electrode GE, and an input electrode SE and an output electrode DE that are electrically connected to the semiconductor layer AL.

The semiconductor layer AL is disposed on the first base layer 101. The display device DS may further include a buffer layer disposed between the first base layer 101 and the semiconductor layer AL. The buffer layer may be an inorganic film and/or an organic film. The buffer layer helps prevent characteristic degradation of the semiconductor layer, which may occur in a subsequent process.

The semiconductor layer AL may include, for example, amorphous silicon (a-Si), polycrystalline silicon (poly-Si), an oxide semiconductor, an organic semiconductor, etc.

The semiconductor layer AL may be partitioned into a source region, a drain region, and a channel region disposed between the source region and the drain region on a plane. The source region and the drain region may be regions doped with impurities. When voltage is applied to the second thin film transistor TFT2, carriers existing in the source region or the drain region may be transferred through the channel region.

A first insulation layer INL1 is disposed on the semiconductor layer AL. The first insulation layer insulates layers to be formed in subsequent processes from the semiconductor layer AL. The first insulation layer INL1 includes an organic film and/or an inorganic film.

A control electrode GE is disposed on the first insulation layer INL1. As described above, the control electrode GE is connected to the output electrode of the first thin film transistor TFT1 (see FIG. 1B).

The control electrode GE receives a signal turning on/off the second thin film transistor TFT2. The control electrode GE is disposed so as to correspond to the channel region. The control electrode GE may include a conductive metal, a conductive semiconductor, or a conductive polymer.

The scan lines SL1 to SL2 (see FIG. 1A) may be disposed on the first insulation layer INL1. The scan lines SL1 to SLn may be formed concurrently with the control electrode GE in the same process as the process of forming the control electrode GE.

A second insulation layer INL2 is disposed on the first insulation layer INL1. The second insulation layer INL2 electrically insulates the control electrode GE and the scan lines SL1 to SLn from other configurations. The second insulation layer INL2 has a first contact hole TH1 and a second contact hole TH2 spaced apart from each other.

An input electrode SE and an output electrode DE are disposed on the second insulation layer INL2 so as to be spaced apart from each other on a plane. The input electrode SE and the output electrode DE may be respectively connected to the source region and the drain region through the first contact hole TH1 and the second contact hole TH2.

The data lines DL1 to DLm (see FIG. 1A) may be disposed on the second insulation layer INL2. The data lines DL1 to DLm may be formed concurrently with the input electrode SE and the output electrode DE in the same process as the process of forming the input electrode SE and the output electrode DE.

A third insulation layer INL3 is disposed on the second insulation layer INL2. The third insulation layer INL3 electrically insulates the input electrode SE, the output electrode De, and the data lines DL1 to DLm from other configurations.

The element layer 103 is disposed on the circuit layer 102. The element layer 103 may include a first electrode layer ED1, an organic layer EL, and a second electrode layer ED2. The first electrode layer ED1 is disposed on the third insulation layer INL3. The first electrode layer ED1 may include a plurality of electrode patterns disposed on each of the emission regions EA11 to EAnm.

The first electrode layer ED1 may be a pixel electrode or an anode. The first electrode layer ED1 may be formed of a material having a high work function such that holes are easily injected.

The first electrode layer ED1 includes a conductive material. The first electrode layer ED1 may be a reflective electrode, a semi-transmissive electrode, or a transmissive electrode. The first electrode layer ED1 may be a single layer or a multi-layer.

A pixel definition layer PDL may be disposed on the third insulation layer INL3. The pixel definition layer PDL overlaps the non-emission region NPXA.

The pixel definition layer PDL exposes portions respectively overlapping the emission regions PX11 to PXnm of the first electrode layer ED1. An organic layer EL is disposed on the first electrode layer ED 1. The organic layer EL includes emission patterns, a hole transport region FL1 (or a hole control layer), and an electron transport region FL2 (or an electron control layer). FIG. 2B illustrates one emission pattern EML.

The emission pattern EML is disposed on each of emission regions EA22, EA23, EA24, EA32, EA33, and EA34. The emission pattern EML receives an electric signal to generate light.

The emission pattern EML may be formed of at least one selected from materials emitting red, green, or blue light, and include a fluorescent material or a phosphorescent material. Also, the emission pattern EML may include a host material and a dopant material. The host material and the dopant material may include a generally used host material or dopant material, respectively.

The hole transport region FL1 is a region via which holes injected from the first electrode layer ED1 are in order to reach the emission pattern EML. The hole transport region FL1 may include at least one selected from a hole injection layer, a hole transport layer, and a single layer that has a hole injection function and a hole transport function at the same time.

The hole transport region FL1 may be formed of at least one selected from a hole injection material and a hole transport material. Each of the hole injection material and the hole transport material may be a generally used material.

The hole transport region FL1 may further include a hole blocking layer. When the hole transport region FL1 includes the hole blocking layer, the hole transport region FL1 may include a generally used hole blocking material.

The hole transport region FL1 may further include a charge generating material. The charge generating material may be uniformly dispersed in the hole transport region FL1 to form a single region, or may be nonuniformly dispersed to partition the hole transport region FL1 into a plurality of regions.

The electron transport region FL2 is defined between the emission pattern EML and the second electrode layer ED2. The electron transport region FL2 is a region via which electrons injected from the second electrode layer ED2 are in order to reach the emission pattern EML.

The electron transport region FL2 may include at least one selected from a hole blocking layer, an electron transport layer, and an electron injection layer, etc. For example, the electron transport region FL2 may have a structure in which an electron transport layer and an electron injection layer; or an hole blocking layer, an electron transport layer, and an electron injection layer are sequentially stacked from the emission pattern EML, respectively, or may have a single-layered structure in which at least two layers of the above-described layers are mixed with each other, etc.

The electron transport region FL2 may include at least one selected from an electron transport material and an electron injection material. Each of the electron injection material and the electron transport material may be a generally used material.

The second electrode layer ED2 is disposed on the first electrode layer ED1. The second electrode layer ED2 receives the second power voltage ELVSS.

The second electrode layer ED2 is opposed to the first electrode layer ED1. For example, when the first electrode layer ED1 is an anode, the second electrode layer ED2 may be a cathode. Therefore, the second electrode layer ED2 may be formed of a material having a low work function such that electrons are easily injected.

The second electrode layer ED2 includes a conductive material. The conductive material may be a metal, an alloy, a conductive compound, or a mixture thereof. The second electrode layer ED2 may include at least one selected from a reflective material and a transparent material.

The second electrode layer ED2 may be a single layer or a multi-layer. The multi-layer may include at least one selected from a layer that is formed of a reflective material, and a layer that is formed of a transparent material.

The second electrode layer ED2 may be a reflective electrode, a semi-transmissive electrode, or a transmissive electrode. In other embodiments, the second electrode layer ED2 may be formed of various materials depending on a structure of an organic light-emitting diode (OLED).

In the present example embodiment, the second electrode layer ED2 overlaps emission regions EA22, EA23, EA24, EA32, EA33, and EA34, and the non-emission region NPXA. Therefore, the second electrode layer ED2 overlaps each of the first electrode layer ED1 and the pixel definition layer PDL. For example, the second electrode layer ED2 may cover an entire surface of the pixel region PXA.

The second electrode layer ED2 receives the second power voltage ELVSS form the power line VL. The second electrode layer ED2 is electrically connected to the power line VL. In the present example embodiment, a portion of the second electrode layer ED2 extends to the peripheral region NPXA to be directly connected to the power line VL.

This configuration is provided as only one example, and a connection method of the second electrode layer ED2 and the power line VL may be varied, for example, the second electrode layer ED2 may be electrically connected to the power line VL through a separate contact electrode.

The protection layer 104 is disposed on the element layer 103. The protection layer 104 is disposed on the second electrode layer ED2 to insulate the second electrode layer ED2 from other configurations disposed on the second electrode layer ED2. Also, the protection layer 104 helps prevent the penetration of moisture and oxygen into the organic light-emitting diode (OLED).

The protection layer 104 may be non-conductive. The protection layer 104 may be constituted of at least one layer. The protection layer 104 includes at least one selected from an inorganic film and an organic layer.

The protection layer 104 overlaps the emission regions EA22, EA23, EA24, EA32, EA33, and EA34, and the non-emission region NPXA. The protection layer 104 may have the same shape as the second electrode layer ED2, and cover an entire surface of the second electrode layer ED2.

The second substrate 200 includes a second base layer 201 and an auxiliary electrode layer SEL. The second base layer 201 may be a transparent insulation substrate. For example, the second base layer 201 may be a glass substrate or a plastic substrate.

The second base layer 201 may be at least a region of the first base layer 101. A driving circuit unit DC may be disposed on the exposed region of the first base layer 101. This configuration is provided as only one example, and the second base layer 201 may have the same shape as the first base layer 101, etc.

The second base layer 201 includes a first surface facing the first substrate 100 and a second surface opposed to the first surface. The auxiliary electrode layer SEL is disposed on the first surface of the second base layer 201.

The auxiliary electrode layer SEL is electrically connected to the first substrate 100. The auxiliary electrode layer SEL may include a conductive layer CL and a plurality of nanorods, which are electrically connected to each other.

The conductive layer CL is disposed on the first surface. The conductive layer CL may cover at least a portion of the first surface. The conductive layer CL overlaps the emission regions EA22, EA23, EA24, EA32, EA33, and EA34, and the non-emission region NPXA.

The conductive layer CL electrically connects the nanorods NR. In the example present embodiment, the conductive layer CL may have the same shape as the second electrode layer ED2. This configuration is provided as only one example, and the conductive layer CL may have another suitable shape that connects the nanorods NR.

The nanorods NR extend from the conductive layer CL to the first substrate 100. Each of the nanorods NR includes one side that is connected to the conductive layer CL, and the other side that is connected to the one side and faces the first substrate 100.

The nanorods NR may be formed of a conductive material. The nanorods NR may be formed of the same material as the conductive layer CL. For example, the nanorods NR may be formed of a transparent conductive oxide.

At least a portion of the nanorods NR is defined as a connection part. FIG. 3A illustrates the nanorods NR all being defined as a connection part. For example, the nanorods NR may penetrate the protection layer 104 to electrically connect the second electrode layer ED2 and the conductive layer CL.

The nanorods NR allow the same voltage to be shared between the second electrode layer ED2 and the conductive layer CL. The conductive layer CL and the second electrode layer ED2 share the second power voltage ELVSS through the nanorods NR.

The second power voltage ELVSS may be uniformly supplied to the pixels PX11 to PXnm through the nanorods NR. The second power voltage ELVSS shared through the conductive layer CL may be uniformly supplied, through a connection part CP, even to a pixel far away from the power line VL that is disposed on the peripheral region NPXA.

The second electrode layer ED2 according to an example embodiment has one-body shape covering each of the pixels PX11 to PXnm. The second electrode layer may have high sheet resistance. The second electrode layer ED2 is connected to the conductive layer CL through the nanorods NR disposed on a plurality of regions. Thus, a voltage drop phenomenon according to a region may be reduced or prevented.

The nanorods NR may have various shapes. For example, each of the nanorods NR may have a cylinder shape, a faceted cylinder shape, a cone shape, or a faceted cone shape. In other embodiments, each of the nanorods NR may have a shape that has a predetermined diameter on a plane. The nanorods NR may has a height greater than a diameter thereof on a cross-section.

Each of the nanorods NR may have a diameter ranging from about 10 nm to 120 nm. Each of the nanorods may have a diameter that is defined as the maximum length of a diagonal line measured on a plane.

The connection part CP connected to the second electrode layer ED2 is defined on the non-emission region NEA so as not to affect display characteristics in the emission region EA23. Generally, when the number or the area of the emission regions is increased with respect to the same display region DA, the area or the width of the non-emission region NPXA is decreased.

The display device DS according to an example embodiment uses nano-sized nanorods NR in order to reduce the voltage drop phenomenon of the second electrode layer ED2. Therefore, the connection part CP disposed on the non-emission region NPXA may be provided in a microscopic size in order to correspond to the nanorods NR.

Accordingly, although the width of the non-emission region NPXA narrows, a connection between the auxiliary electrode layer SEL and the second electrode layer ED2 may be easily accomplished. In the display device DS according to an example embodiment, although a high resolution design environment or a high aperture ratio is required, the sheet resistance of the second electrode layer ED2 may be easily reduced, so that uniform power voltage may be supplied to each of pixels PX11 to PXnm.

FIG. 3A illustrates a schematic plan view illustrating a portion of a display device according to an example embodiment, and FIG. 3B is a schematic plan view illustrating a portion of a display device according to an example embodiment. FIG. 3A illustrates a region including the emission region EA23 illustrated in FIG. 2B. FIG. 3B illustrates a region corresponding to a region of FIG. 3A.

As illustrated in FIGS. 3A and 3B, emission regions EA22, EA23, EA24, EA32, EA33, and EA34 are spaced apart from each other, and may be arranged in a matrix configuration. Since a non-emission region NEA is defined between the emission regions EA22, EA23, EA24, EA32, EA33, and EA34, the non-emission region NEA may have a lattice shape.

The connection part CP overlaps at least a portion of the non-emission region NEA. Therefore, the nanorods NR may be disposed between the emission regions EA22, EA23, EA24, EA32, and EA34.

When the connection part CP is provided in plurality, the connection parts CA are spaced apart from each other, and are arranged on the non-emission region NEA. The connection parts CP may be regularly or irregularly arranged. FIG. 3A exemplarily illustrates embodiments in which the connection parts CP are irregularly arranged.

As illustrated in FIG. 3A, the nanorods NR may be disposed on a region defined between the emission regions arranged in a first direction D1 among the non-emission region NEA. Accordingly, the connection parts CP extend in a second direction D2, are spaced apart from each other, and may be arranged in the first direction D1.

In another example embodiment, the nanorods NR may be disposed between the emission regions arranged in the second direction D2. The connection parts CP may extend in a first direction D1, are spaced apart from each other, and may be arranged in the second direction D2.

In another example embodiment, as illustrated in FIG. 3, the nanorods NR may be arranged along the non-emission region. The connection parts of FIG. 3A are connected to each other, and thus may be provided as a single connection part CP-1 having one body. Accordingly, the connection part CP-1 may have the same shape as the non-emission region NEA.

The nanorods NR may be disposed on an entire surface of the second substrate 200. Although the nanorods NR are disposed on the entire surface, the nanorods NR are not connected to the first substrate 100 due to a height thereof. Among the nanorods NR, nanorods overlapping the non-emission region NEA may be connected to the second electrode layer ED2, and nanorods overlapping the emission regions EA11 to EAnmj may be spaced apart from the second electrode layer ED2.

Figure 4A:
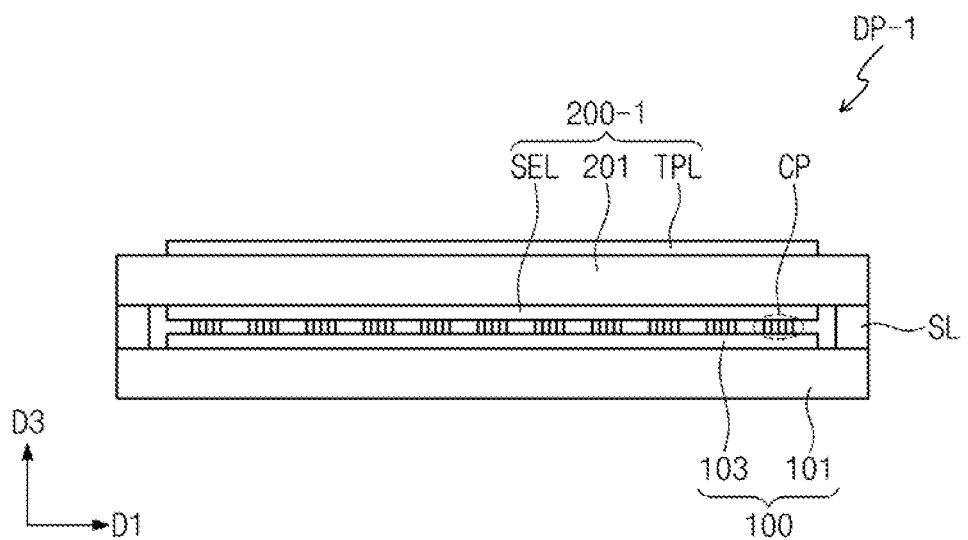
FIG. 4A illustrates a cross-sectional view illustrating a display device according to an example embodiment.
Figure 4B:
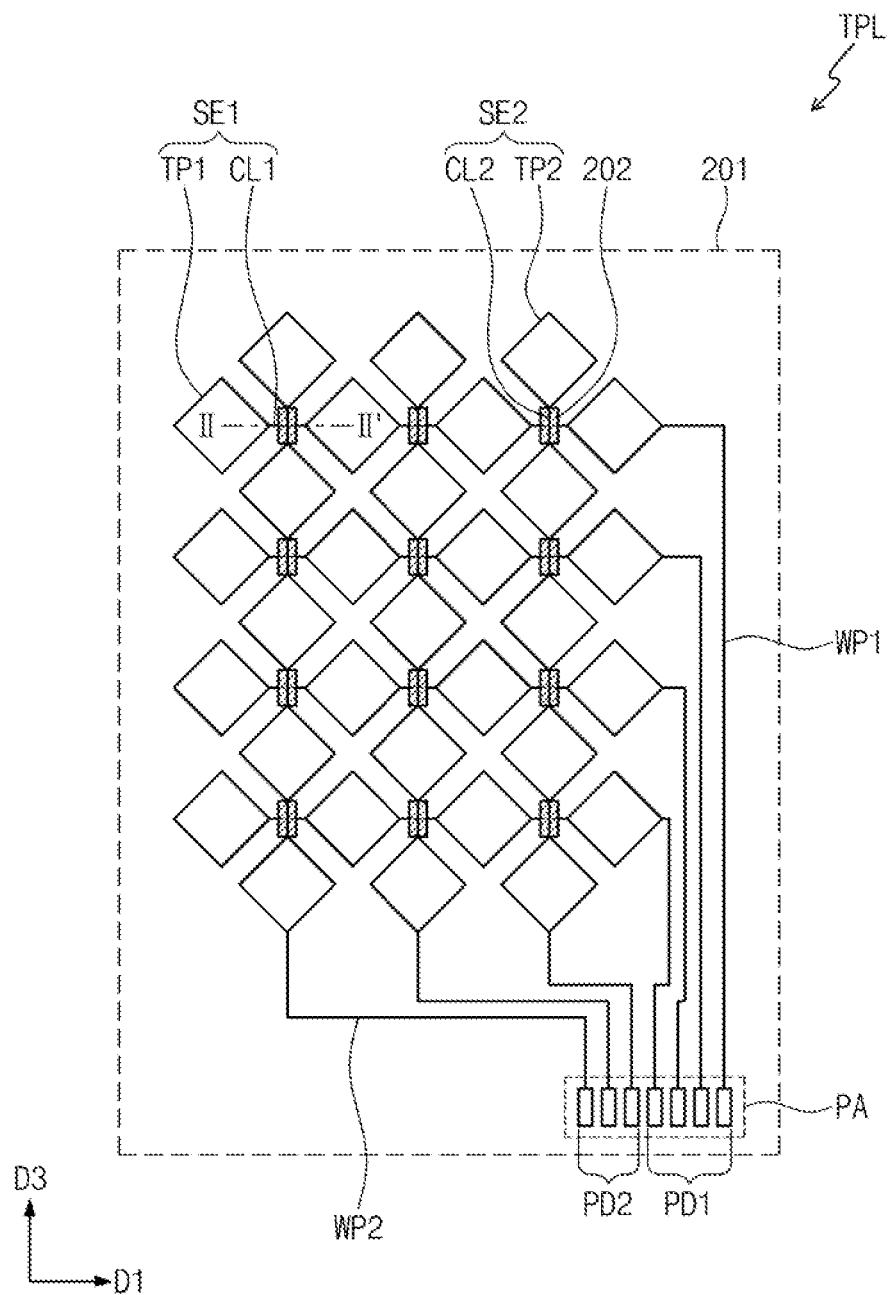
FIG. 4B illustrates a plan view illustrating a touch electrode layer illustrated in FIG. 4A.

FIG. 4A illustrates a cross-sectional view illustrating a display device according to an example embodiment. FIG. 4B illustrates a plan view illustrating a touch electrode layer illustrated in FIG. 4A. A display panel DP-1 further includes a touch electrode layer TPL.

The touch electrode layer TPL is disposed on the second surface of the second base layer 201. The touch electrode layer TPL includes a plurality of touch cells SE1 and SE2, a plurality of connection lines WP1 and WP2, and a plurality of pads PD1 and PD2.

The touch cells SE1 and SE2 may include a first touch cell SE1 and a second touch cell SE2. The first touch cell SE1 and the second touch cell SE2 may be disposed on the same layer.

The first touch cell SE1 includes a plurality of first touch patterns TP1 that are spaced apart from each other and arranged in a first direction, and a plurality of first connection patterns CP1 that connect touch patterns adjacent to each other among the first touch patterns TP1.

The second touch cell SE2 includes a plurality of second touch patterns TP2 that are spaced apart from each other and arranged in a second direction, and a plurality of second connection patterns CP2 that connect touch patterns adjacent to each other among the second touch patterns TP2. The first connection patterns CP1 and the second connection patterns CP2 intersect with each other and are insulated from each other.

At this time, the second touch cell SE2 may further include a plurality of insulation patterns 202. The insulation patterns 202 overlap the first connection pattern CP1 and the second connection patterns CP2. The first connection patterns CP1 and the second connection patterns CP2 may intersect with each other and be insulated from each other with the plurality of insulation patterns 202 in-between.

The first touch cell SE1 and the second touch cell SE2 may be disposed on the different layers. The first touch cell SE1 and the second touch cell SE2 may be disposed on the different layers with a predetermined insulation film in-between. The insulation patterns 202 may be omitted.

The connection lines WP1 and WP2 include a first connection line WP1 and a second connection line WP2. The pads PD1 and PD2 may be disposed on a region PA overlapping the peripheral region NPXA. The pads PD1 and PD2 include a first pad PD1 and a second pad PD2.

The first connection line WP1 connects the first touch cell SE1 and the first pad PD1. The second connection line WP2 connects the second touch cell SE2 and the second pad PD2. Each of the first touch cell SE1 and the second touch cell SE2 may be provided in plurality. In addition, the first connection line WP1, the second connection line WP2, the first pad PD1, and the second pad PD2 may be respectively provided in plurality so as to correspond to the number of the first touch cell SE1 and the second touch cell SE2.

FIG. 5A to 5E illustrate views of stages in a method of manufacturing an organic light-emitting display device according to an example embodiment.

Hereinafter, a method of manufacturing an organic light-emitting display device will be described with reference to the accompanying drawings. Meanwhile, the same configurations as those illustrated in FIGS. 1 to 4B will be represented by the same reference numerals, and a detailed description thereof will be omitted.

As illustrated in FIG. 5, a first substrate is provided. A circuit layer 102 is formed on a first base layer 101. The circuit layer 102 may be formed by forming a thin film transistor TFT2 through at least one process selected from a generally used deposition process, a photo process, and a crystallization process.

Figure 5A:
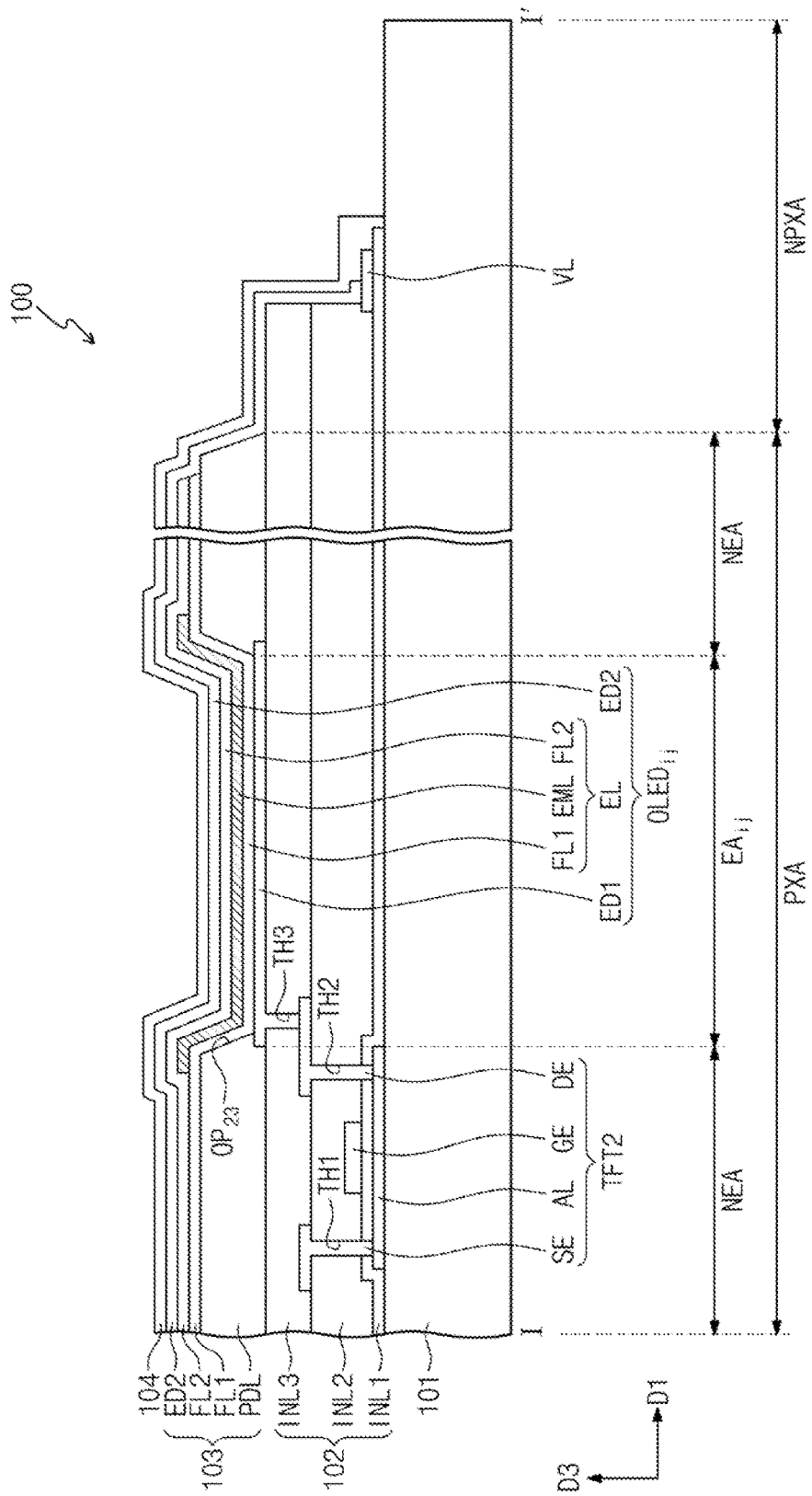
FIG. 5A to 5H illustrate cross-sectional views illustrating a method of manufacturing an organic light-emitting display device according to an example embodiment.

A power line VL may be formed in the same process as a process of forming the circuit layer 102. For example, the power line VL may be formed concurrently with a control electrode GE as shown in FIG. 5A.

In another example embodiment, the power line VL may be formed concurrently with an input electrode SE and an output electrode DE. The power line VL may be disposed on a second insulation layer INL2.

After that, an element layer 103 is formed on the circuit layer 102. A conductive layer is patterned on the circuit layer 102 to form a first electrode layer ED1, a layer is formed of an inorganic material on the first electrode layer ED1, and then the layer is patterned to form a pixel definition layer PDL. Openings exposing at least a portion of the first electrode layer ED1 may be defined through a patterning process.

A hole transport region FL1, an emission pattern EML, an electron transport region FL2, and a second electrode layer ED2 are sequentially formed on the first electrode layer ED1 to form an organic light-emitting diode (OLED). The organic light-emitting diode (OLED) may be formed through a deposition or patterning process.

The second electrode layer ED2 may be formed so as to overlap the power line VL. As illustrated in FIG. 5A, a first insulation layer INL1 and a second insulation layer INL2 may be formed so as to expose at least a portion of the power line VL.

The second electrode layer ED2 may cover the first insulation layer INL1 and the second insulation layer INL2, and may be formed so as to extend up to the power line VL. In another example embodiment, the second electrode layer ED2 may be formed so as to be spaced apart from the power line VL, and a predetermined conduction part connecting the power line VL and the second electrode layer ED2 may be further formed.

In another example embodiment, the first insulation layer INL1 and the second insulation layer INL2 may be formed so as to cover the power line VL. A predetermined through-hole for connecting the power line VL and the second electrode layer ED2 may be formed on the first insulation layer INL1 and the second insulation layer INL2.

A protection layer 104 is formed on the element layer 103. The protection layer 104 may be formed by depositing an insulation material on the element layer 103. The protection layer 104 is formed so as to cover all of the element layer 103 and the power line VL.

Figure 5B:
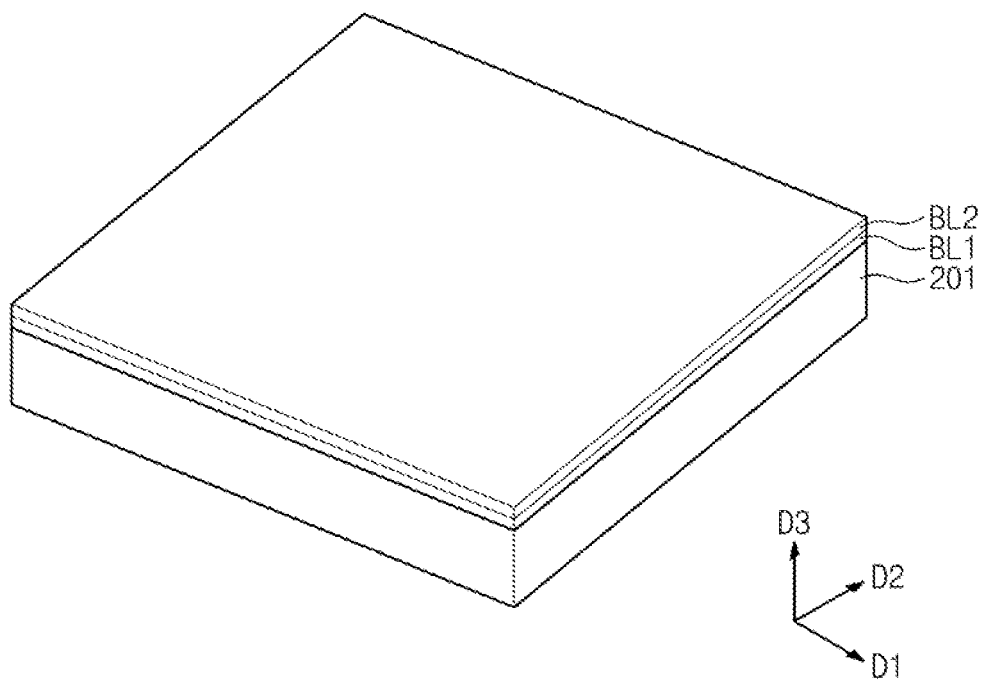
Figure 5C:
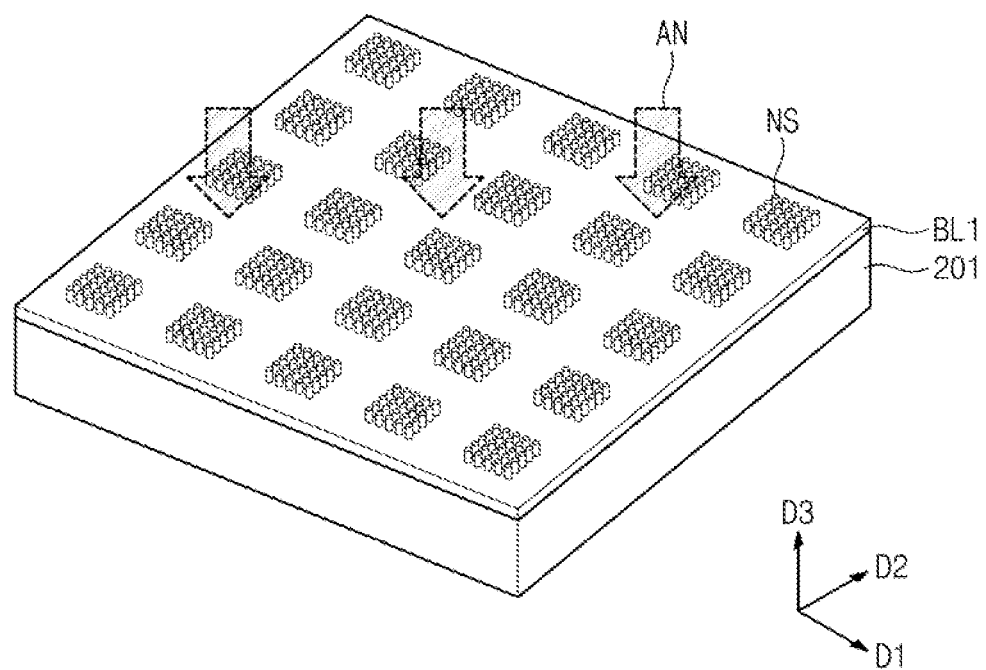
Figure 5D:
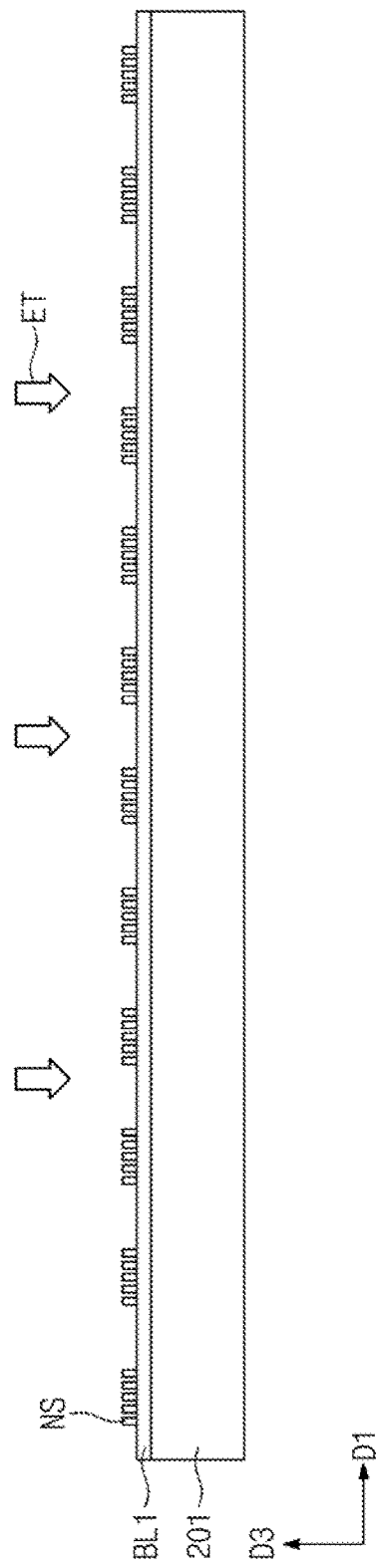

FIGS. 5B to 5D illustrate a process of providing a second substrate. As illustrated in FIG. 5B, a first layer and a second layer are sequentially formed on a second base layer. The first layer BL1 and the second layer BL2 cover an entire surface of the second base layer 201.

The first layer BL1 may be formed of a conductive material. For example, the first layer BL1 may be formed of a transparent conductive oxide (TCO) such as indium tin oxide, indium oxide, tin oxide, indium zinc oxide, zinc oxide, or indium tin zinc oxide.

The second layer BL2 may be formed of a conductive material. The second layer BL2 may be formed of a conductive material that is easily oxidized. For example, the second layer BL2 may include aluminum.

As illustrated in FIGS. 5C and 5D, the second layer BL2 is anodized (AN) to form a plurality of nanostructures NS. The nanostructures NS may be arranged so as to form a plurality of groups spaced apart from each other.

The nanostructures NS may be formed of a metal oxide. For example, the nanostructures NS may be formed of a metal oxide forming the second layer BL2.

When the second layer BL2 is formed of aluminum, the nanostructures NS may include an aluminum oxide (AlOx). Each of the nanostructures NS may have a single layer, a multi-layer, etc.

The nanostructures NS may be formed through various processes. For example, in the present embodiment, the nanostructures NS may be formed through an anodization method.

An initial substrate SUB is provided in an electrolyte (not shown) through the anodization method. The substrate SUB is exposed to a strong acid atmosphere for a predetermined time to anodize the second layer BL2.

As the second layer BL2 is anodized, a surface of the second layer BL2 is oxidized to form a metal oxide. The metal oxide includes nano-sized porosities regularly or irregularly distributed, and is grown with anisotropy. The nano-sized nanostructure NS may be formed of the metal oxide.

Figure 5E:
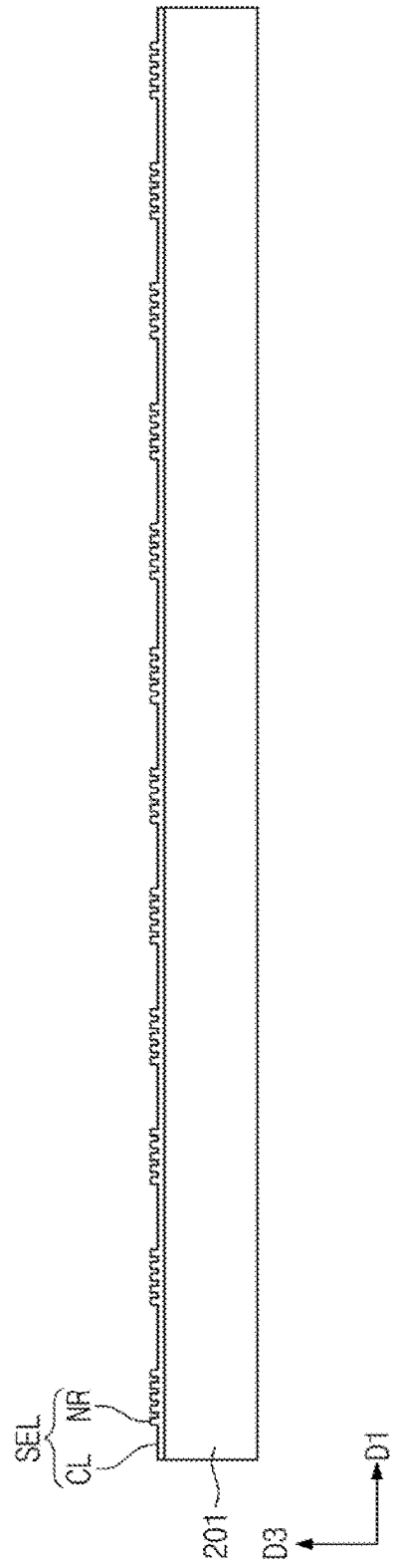

As illustrated in FIG. 5E, an etching process is performed by using the nanostructures NS as a mask. Portions of the first layer BL1 exposed by the nanostructures NS are etched to form an auxiliary electrode layer SEL.

The auxiliary electrode layer SEL may have a structure in which a plurality of nanorods NR corresponding to the nanostructures NS; and a conductive layer CL are integrally formed. This configuration is provided as only one example, and the auxiliary electrode layer SEL according to an example embodiment may have various structures. For example, when the second layer BL2 is constituted of a plurality of layers, and only a top layer of layers constituting the second layer BL2 is selectively patterned, the plurality of nanorods NR and the conductive layer CL may be formed so as to respectively have independent configurations.

Figure 5F:
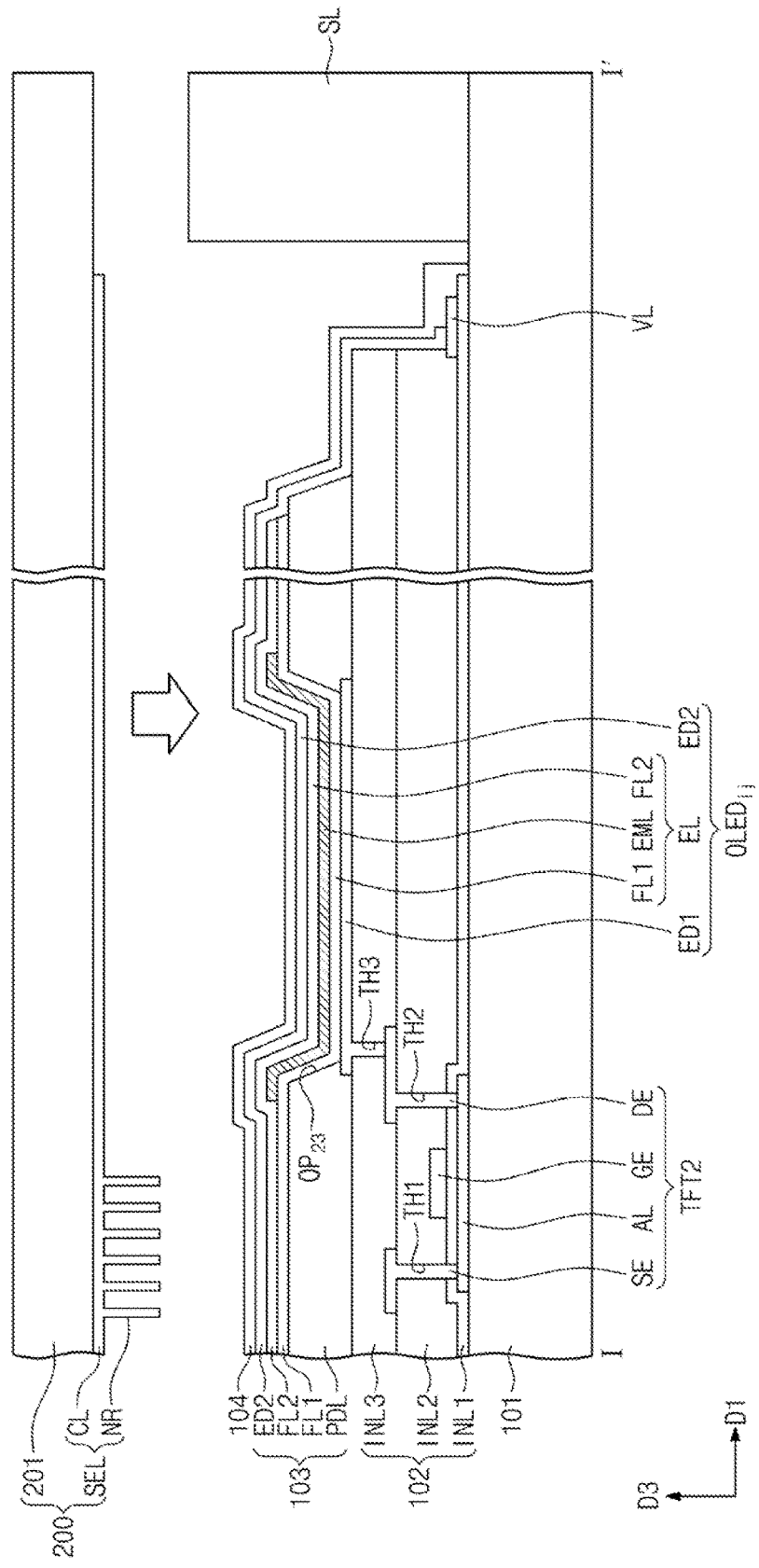
Figure 5G:
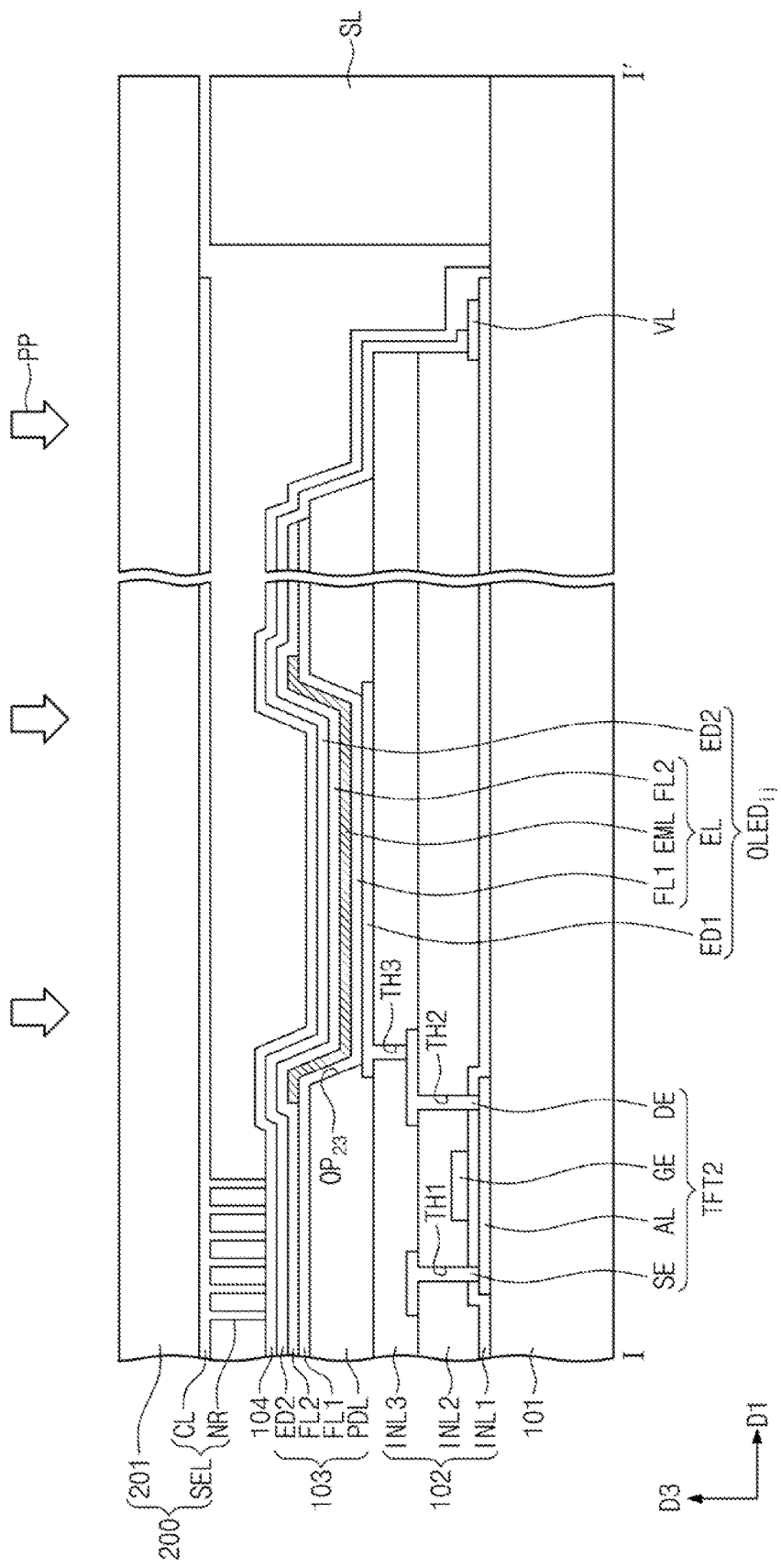
Figure 5H:
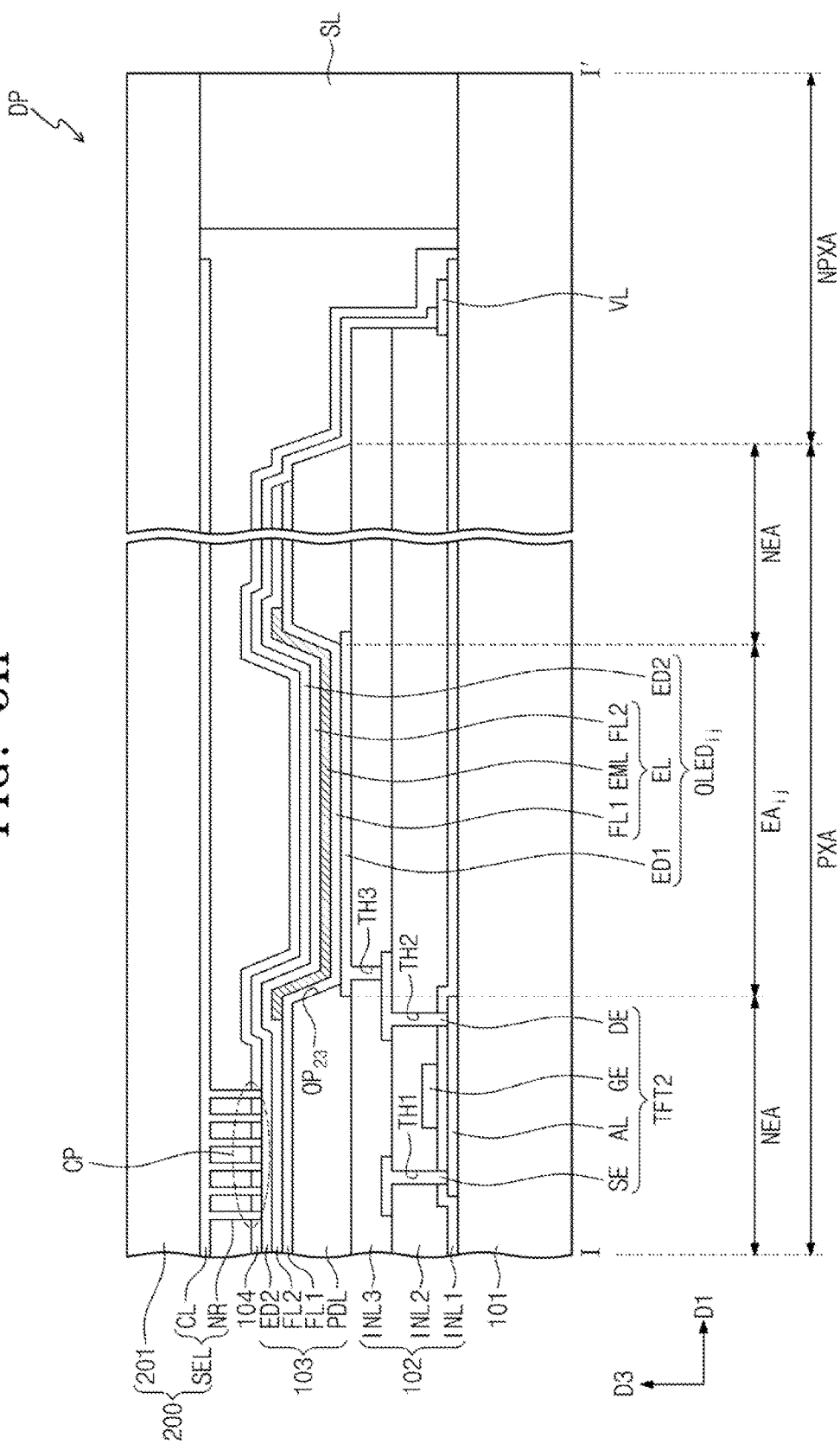

FIGS. 5F to 5H illustrates a process of coupling the first substrate 100 and the second substrate 200. FIGS. 5F to 5H illustrates a region corresponding to a region of the display panel DP.

As illustrated in FIG. 5F, the second substrate 200 is disposed on the first substrate 100. The second substrate 200 is disposed in a direction in which the auxiliary electrode layer SEL faces the first substrate 100.

A sealing member SL may be disposed on the first substrate 100. The sealing member SL is disposed along an edge of the first substrate 100. This configuration is provided as only one example, and after the first substrate 100 and the second substrate 200 are connected, the sealing member SL may be disposed between the first substrate 100 and the second substrate 200.

As illustrated in FIGS. 5G and 5H, the second substrate 200 is disposed on the first substrate 100 such that the auxiliary electrode layer SEL contacts the first substrate 100. For example, the second substrate 200 may be close to the first substrate 100 until the nanorods NR contact an upper surface of the protection layer 104 that is a top portion of the first substrate 100. FIG. 5G illustrates a state in which the nanorods NR contact the protection layer 104 on a non-emission region NEA.

Pressure PP is applied to the second substrate 200 to electrically connect the second substrate 200 and the first substrate 100. A protection layer of region AA', which contacts the nanorods NR by the pressure PP, is penetrated by the nanorods NR. The pressure PP may sufficient for the nanorods NR to punch the protection layer 104.

At least a portion of the nanorods NR penetrates the protection layer 104 to electrically contact the second electrode layer ED2. Accordingly, at least one connection part CP is formed on the display panel DP.

In the display panel according to an example embodiment, the pressure PP is applied to the second substrate 200, so that the second substrate 200 may be electrically connected to the first substrate 100. The display panel DP has nanorods NR and, thus, although a separate through-hole is not formed in the protection layer 104, the second substrate 200 may be electrically connected to the second electrode layer ED2 covered by the protection layer 104.

A space between the first substrate 100 and the second substrate 200 may be filled with a predetermined filler. The filler may be interposed before or after the first substrate 100 and the second substrate 200 are connected.

As illustrated in FIG. 5H, the first substrate 100 and the second substrate 200 are physically coupled. For example, the first substrate 100 and the second substrate 200 may be coupled by heating the sealing member SL disposed on the peripherally region NPXA. In another example embodiment, the sealing member may be disposed after the first substrate 100 and the second substrate 200 are electrically connected.

By way of summation and review, organic light-emitting display devices may be classified as top-emission type organic light-emitting display devices and bottom-emission type organic light-emitting display devices depending on the emitting direction of light. The top-emission type organic light-emitting display device may have a high aperture ratio compared to the bottom-emission type organic light-emitting display device.

In the top-emission type organic light-emitting display device, since light is transmitted through a cathode, the cathode should be formed of a conductive material and concurrently have transparent characteristics. Such a semi-transmissive material may be thin, and may present complications to forming a low resistance cathode. Thus, a voltage drop (IR drop) phenomenon may occur in the cathode. As the size of the organic light-emitting display device increases, the voltage drop phenomenon may become more significant.

As described above, embodiments relate to a display device that may reduce or prevent voltage drop of a cathode, and a method of manufacturing the same.

An organic light-emitting display device according to an example embodiment includes a first substrate including a non-conductive protection layer and a second substrate having a plurality of nanorods extending toward the first substrate. As the first substrate and the second substrate are coupled, the nanorods may penetrate the protection layer to be connected to an organic light-emitting diode disposed on a lower surface of the protection layer. Therefore, according to an example embodiment, the sheet resistance of a cathode electrode layer formed on an entire surface of the organic light-emitting diode may be reduced.

Also, since the nanorods may have a nano-sized fine diameter, and be formed of a transparent conductive material, the effects thereof on the aperture ratio of the display device may be reduced. Therefore, in a small-sized display device or a high definition display device, the resistance of the cathode may be easily reduced, and the display quality of the display device may be improved.

The present disclosure may provide a display device capable of preventing a drop of a cathode voltage applied to each of pixels, and a method of manufacturing the same.

Herein, it will be understood that although the terms first and second are used herein to describe various elements, these elements should not be limited by these terms. The terms are only used to distinguish one element from other elements. For example, a first element could be termed a second element, and, similarly, a second element could be termed a first element, without departing from the scope of example embodiments. The terms of a singular form may include plural forms unless referred to the contrary.

It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof. In the description, it will be understood that when an element such as a layer, film, region, or substrate is referred to as being "above" or "on" another element, it can be directly on the other element or intervening elements may also be present. In the description, it will be understood that when an element such as a layer, film, region, or substrate is referred to as being "above" or "on" another element, it can be directly on the other element or intervening elements may also be present.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light-emitting display device, comprising:
   a first substrate including a first base layer, an element layer disposed on the first base layer and including a plurality of emission patterns, and a protection layer that is non-conductive, the protection layer covering the element layer; and
   a second substrate disposed on the first substrate, and the second substrate including a plurality of nanorods extending toward the first substrate, at least a portion of the nanorods penetrating the protection layer, the second substrate being electrically connected to the element layer through the nanorods penetrating the protection layer.

2. The organic light-emitting display device as claimed in claim 1, wherein each of the nanorods has a diameter ranging from about 10 nm to about 120 nm.

3. The organic light-emitting display device as claimed in claim 2, wherein:
   the first substrate is partitioned into a plurality of emission regions overlapping the emission patterns respectively, and a non-emission region adjacent to the emission regions, and
   the nanorods penetrating the protection layer are connected to the element layer at the non-emission region.

4. The organic light-emitting display device as claimed in claim 3, wherein the element layer includes:
   a first electrode layer to receive a first power voltage;
   a pixel definition layer overlapping the non-emission region, and exposing portions of the first electrode layer, the portions overlapping the emission regions;
   an organic layer disposed on the first electrode layer, and including the emission patterns; and
   a second electrode layer disposed between the organic layer and the protection layer, and the second electrode layer to receive a second power voltage different from the first power voltage,
   wherein the nanorods penetrating the protection layer are directly connected to the second electrode layer.

5. The organic light-emitting display device as claimed in claim 4, wherein:

the second electrode layer includes a first portion overlapping the emission regions, and a second portion overlapping the non-emission region, and the nanorods penetrating the protection layer contact the second portion, and are spaced apart from the first portion.

6. The organic light-emitting display device as claimed in claim 4, wherein the second substrate further includes:

a second base layer including a first surface facing the first substrate, and a second surface opposed to the first surface; and a conductive layer disposed on the first surface to be connected to the nanorods, and overlapping the emission regions and the non-emission region, the conductive layer to receive the second power voltage through the nanorods penetrating the protection layer.

7. The organic light-emitting display device as claimed in claim 6, wherein the nanorods include a transparent conductive oxide.

8. The organic light-emitting display device as claimed in claim 7, wherein the conductive layer is formed of the same material as the nanorods.

9. The organic light-emitting display device as claimed in claim 6, wherein the second base layer is a glass substrate.

10. The organic light-emitting display device as claimed in claim 6, wherein the second substrate further includes a touch electrode layer that is disposed on the second surface to sense a touch event that occurs on the second surface.

11. The organic light-emitting display device as claimed in claim 4, further comprising:

a sealing member disposed between the first substrate and the second substrate to seal and couple the first substrate and the second substrate, the first substrate being partitioned into a pixel region including the emission regions, and a peripheral region surrounding the pixel region, the sealing member being disposed at the peripheral region; and a filler interposed between the first substrate and the second substrate that are sealed by the sealing member.

12. The organic light-emitting display device as claimed in claim 11, wherein the sealing member includes an inorganic material.

13. The organic light-emitting display device as claimed in claim 11, further including a power line to apply the second power voltage to the second electrode layer, the power line being disposed between the sealing member and the pixel region in a plan view.

* * * * *